(12) United States Patent
Kim et al.

(10) Patent No.: US 7,173,480 B2
(45) Date of Patent: Feb. 6, 2007

(54) DEVICE FOR CONTROLLING THE OPERATION OF INTERNAL VOLTAGE GENERATOR

(75) Inventors: In Soo Kim, Seoul (KR); Young Jun Nam, Kwangju (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 77 days.

(21) Appl. No.: 10/999,418

(22) Filed: Nov. 30, 2004
(Under 37 CFR 1.47)

(65) Prior Publication Data

US 2005/0231269 A1    Oct. 20, 2005

(30) Foreign Application Priority Data

Apr. 19, 2004    (KR) .................. 10-2004-0026533

(51) Int. Cl.
*G05F 1/10* (2006.01)
(52) U.S. Cl. ........................ 327/538; 327/540
(58) Field of Classification Search ................ 327/538, 327/540, 541, 543, 545, 546; 323/313, 316
See application file for complete search history.

(56) References Cited

U.S. PATENT DOCUMENTS

| | | | | |
|---|---|---|---|---|
| 5,448,199 A | * | 9/1995 | Park ........................ | 327/546 |
| 6,339,353 B1 | * | 1/2002 | Tomita et al. ............. | 327/210 |
| 6,438,043 B2 | * | 8/2002 | Gans et al. ................ | 365/194 |
| 6,449,204 B1 | * | 9/2002 | Arimoto et al. ........... | 365/222 |
| 6,452,854 B1 | * | 9/2002 | Kato et al. ................ | 365/226 |
| 6,778,456 B2 | * | 8/2004 | Kim .......................... | 365/222 |
| 2003/0210575 A1 | * | 11/2003 | Seo et al. ............. | 365/189.05 |
| 2004/0017690 A1 | * | 1/2004 | Lee et al. ................ | 365/145 |

FOREIGN PATENT DOCUMENTS

KR    0171952    5/1997

* cited by examiner

*Primary Examiner*—Linh My Nguyen
*Assistant Examiner*—Thomas J. Hiltunen
(74) *Attorney, Agent, or Firm*—Ladas & Parry LLP

(57) ABSTRACT

The present invention discloses a circuit for controlling a timing of overdriving a core voltage (internal voltage) which is a driving voltage of a sense amplifier of a memory device and a duration of the overdriven core voltage, and a method for easily measuring the timing and duration. A device for controlling an operation of an internal voltage generator includes an internal voltage driver for outputting an internal voltage to an output terminal, an internal voltage over-driver for compensating for a potential level of the output terminal, and a controller for controlling an enable timing and a disable timing of the internal voltage over-driver. The controller receives a first control signal and outputs a second control signal, and the second control signal is generated after a predetermined time from reception of the first control signal, an operation of the internal voltage over-driver being controlled according to the second control signal.

20 Claims, 7 Drawing Sheets

DEVICE FOR CONTROLLING THE OPERATION OF INTERNAL VOLTAGE GENERATOR

BACKGROUND OF THE INVENTION

1. Field of the Invention

The present invention relates to a circuit for controlling a timing of overdriving an internal voltage of a memory device, and more particularly to, a circuit for controlling a timing of overdriving a core voltage which is a driving voltage of a sense amplifier of a memory device and a duration of the overdriven core voltage.

2. Description of the Related Art

In general, a memory device is driven by an external power voltage Vext, but internal circuits of the memory device are driven by various levels of internal voltages generated in internal voltage generators of the memory device. Therefore, the levels of the internal voltages must be stabilized to improve the operation of the memory device.

Especially, the read/write operations are major functions of the memory device. It is thus essential to stabilize a core voltage which is one of the internal voltages used for the read/write operations. Here, the core voltage implies an internal voltage used as a driving voltage of a sense amplifier during the read/write operations.

In the auto refresh operation, the read/write operations are performed on a number of memory cells at the same time, which may increase transient current consumption and destabilize the level of the core voltage. Because variations of the core voltage affect the performance and reliability of the memory device, a compensation circuit for restricting rapid variations of the core voltage is generally provided.

FIG. 1 is a circuit diagram illustrating a general core voltage generator.

Referring to FIG. 1, a core voltage driver 101 outputs a core voltage Vcore, and a core voltage over-driver 102 restricts variations of a level of the core voltage Vcore during the operation of a sense amplifier. That is, while the sense amplifier is operated, the core voltage over-driver 102 couples an externally-supplied driving voltage VDD to a core voltage terminal, thereby compensating for power.

A driving timing of the core voltage over-driver 102 is very important. When the core voltage over-driver 102 is operated much earlier or later than the sense amplifier, effects of the core voltage over-driver 102 are reduced.

In addition, how long the core voltage over-driver 102 is operated is also very important. When the core voltage over-driver 102 is operated for an extended period of time, the core voltage Vcore unnecessarily rises.

However, a circuit for precisely monitoring and tuning an operation timing of the core voltage over-driver 102 has not been suggested. It is thus difficult to output stable internal voltages.

Furthermore, after a packaging process of a semiconductor device is finished, the internal voltages of the semiconductor device cannot be externally measured.

SUMMARY OF THE INVENTION

Accordingly, the present invention has been made in an effort to solve the problems occurring in the related art, and an object of the present invention is to provide a device for outputting stabilized internal voltages, by precisely controlling an operation of an over-driver for compensating for the internal voltages.

Another object of the present invention is to provide a method for measuring internal voltages through external pins after finishing a packaging process of a semiconductor device.

In order to achieve the above objects, according to one aspect of the present invention, there is provided a device for controlling an operation of an internal voltage generator, including: an internal voltage driver for outputting an internal voltage to an output terminal; an internal voltage over-driver for compensating for a potential level of the output terminal; and a controller for controlling an enable timing and a disable timing of the internal voltage over-driver.

Preferably, the controller receives a first control signal and outputs a second control signal, and the second control signal is generated after a predetermined time from reception of the first control signal, an operation of the internal voltage over-driver being controlled according to the second control signal.

BRIEF DESCRIPTION OF THE DRAWINGS

The above objects, and other features and advantages of the present invention will become more apparent after a reading of the following detailed description when taken in conjunction with the drawings, in which:

FIG. 2b is a circuit diagram illustrating a controller of FIG. 2a;

DETAILED DESCRIPTION OF PREFERRED EMBODIMENTS

Figure 1:
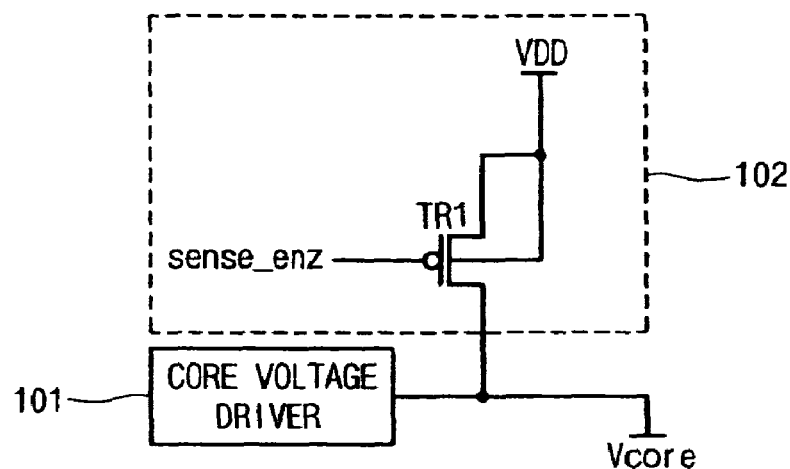
FIG. 1 is a circuit diagram illustrating a general core voltage generator.

Reference will now be made in greater detail to a preferred embodiment of the invention, an example of which is illustrated in the accompanying drawings. Wherever possible, the same reference numerals will be used throughout the drawings and the description to refer to the same or like parts.

Figure 2A:
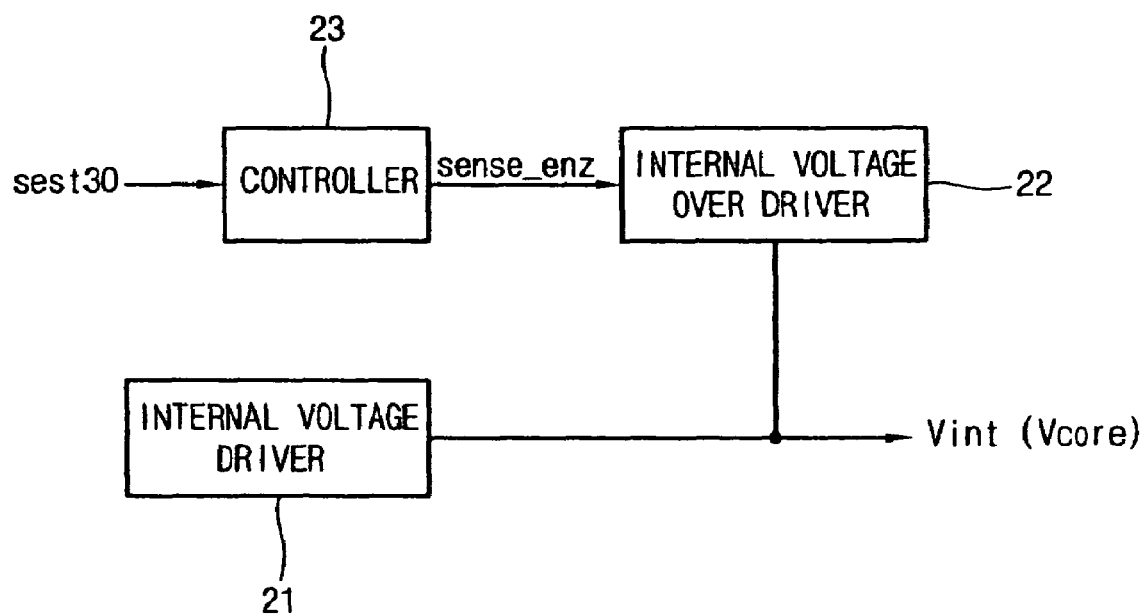
FIG. 2a is a block diagram illustrating a device for controlling an operation of an internal voltage generator in accordance with the present invention.

FIG. 2a is a block diagram illustrating a device for controlling an operation of an internal voltage generator in accordance with the present invention. An internal voltage outputted from the internal voltage generator can be used as a driving voltage for driving, for example, a sense amplifier of a memory device.

As illustrated in FIG. 2a, the device for controlling the operation of the internal voltage generator includes an internal voltage driver 21 for outputting an internal voltage Vint to an output terminal, an internal voltage over-driver 22 for compensating for a potential level of the output terminal, and a controller 23 for controlling an enable timing and a disable timing of the internal voltage over-driver 22.

In FIG. 2a, the internal voltage driver 21 corresponds to the core voltage driver 101 of FIG. 1, and the internal voltage over-driver 22 corresponds to the core voltage over-driver 102 of FIG. 1, which can be constituted in the same manner. In addition, the internal voltage Vint can be the core voltage Vcore mentioned in FIG. 1.

Here, the controller 23 receives a control signal sest30 and outputs a control signal sense_enz. The control signal sest30 is enabled to perform a predetermined internal operation. For example, the control signal sest30 can be generated under an active command of the memory device. The control signal sense_enz is generated after a predetermined time from reception of the control signal sest30, for controlling an operation of the internal voltage over-driver 22.

Figure 2B:
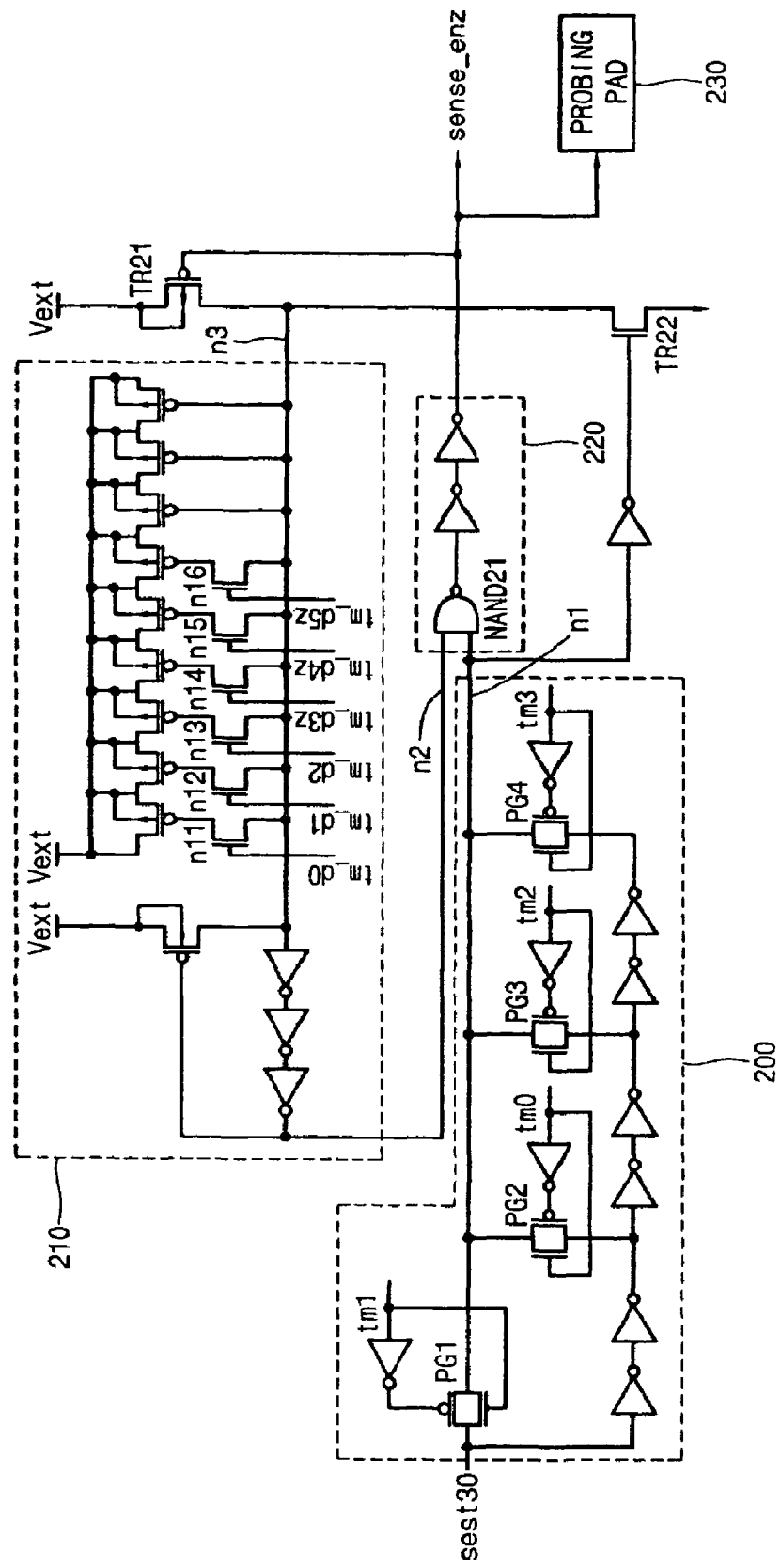

FIG. 2b is a circuit diagram illustrating the controller 23 of FIG. 2a.

As shown in FIG. 2b, the controller 23 includes a delay unit 200 for receiving the control signal sest30, a PMOS transistor TR21 coupled between a power voltage Vext and a node N3, an NMOS transistor TR22 coupled between the node N3 and a ground terminal, a delay unit 210 using the node N3 as an input terminal, and a controller output unit 220 for receiving the output signals from the delay unit 200 and the delay unit 210. The controller output unit 220 is comprised of a NAND gate NAND21, and an even number of inverters coupled to an output terminal of the NAND gate NAND21. The output signal from the controller output unit 220 is the control signal sense_enz for controlling the operation of the internal voltage over-driver 22 of FIG. 2a.

A transmission path of the control signal sest30 supplied to the delay unit 200 is determined by switches PG1, PG2, PG3 and PG4 which are selectively turned on. The switches PG1, PG2, PG3 and PG4 are controlled according to test mode signals tm0, tm1, tm2 and tm3. The test mode signals tm0, tm1, tm2 and tm3 determine a delay time of the delay unit 200, which will later be explained in detail with reference to FIG. 5a.

An output node N1 of the delay unit 200 is coupled to an input terminal of the NAND gate NAND21.

Still referring to FIG. 2b, the controller output unit 220 receives the output signal from the delay unit 200 and the output signal from the delay unit 210. The output from the controller output unit 220 is the control signal sense_enz.

The control signal sense_enz is supplied to a gate of the PMOS transistor TR21 coupled between the power voltage Vext and the node N3.

The delay unit 210 using the node N3 as the input terminal receives a signal from the node N3, delays the signal for a predetermined time, and outputs an inverted signal. That is, the input and output signals of the delay unit 210 have opposite phases.

The delay unit 210 controls an RC delay time by selectively coupling a plurality of MOS transistors n11, n12, n13, n14, n15 and n16 respectively to a plurality of PMOS capacitors. The plurality of MOS transistors n11, n12, n13, n14, n15 and n16 are coupled to the signal transmission line, namely the node N3 according to test mode signals tm_d0, tm_d1, tm_d2, tm_d3z, tm_d4z and tm_d5z, to contribute to determination of the delay time. The test mode signals tm_d0, tm_d1, tm_d2, tm_d3z, tm_d4z and tm_d5z will later be explained in detail with reference to FIG. 5b.

A probing pad 230 is a signal detection pad. Therefore, after a packaging process of a semiconductor device is finished, an operation period of the control signal sense_enz can be externally precisely measured through pins coupled to the probing pad 230, which will later be explained with reference to FIG. 7.

The output signal from the delay unit 200 is inverted by an inverter inv0, and supplied to a gate of the NMOS transistor TR22. As depicted in FIG. 2b, the NMOS transistor TR22 is disposed between the node N3 and the ground.

Figure 3:
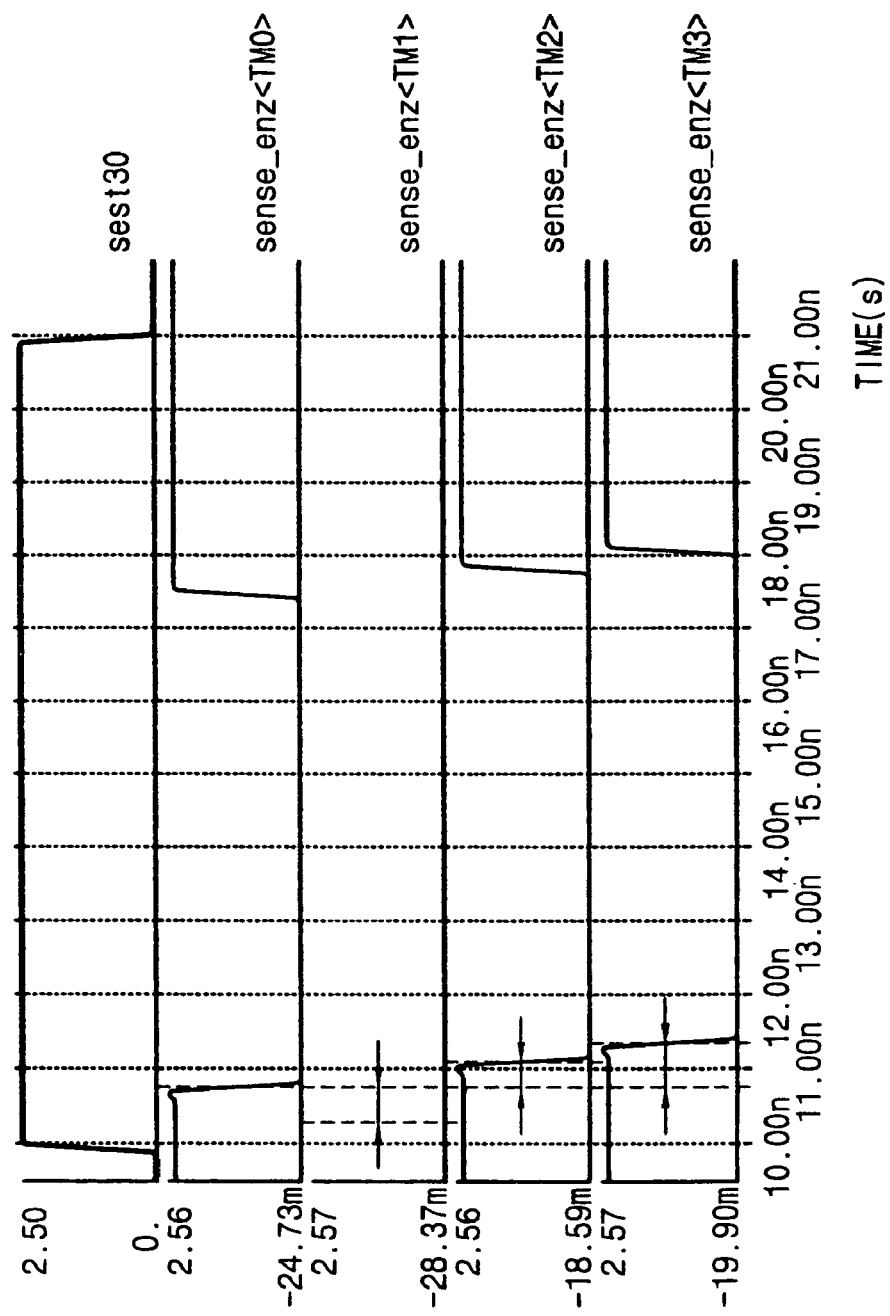
FIG. 3 is a waveform diagram illustrating one example of signals of the circuit of FIG. 2b.

FIG. 3 is a waveform diagram illustrating one example of the signals sest30 and sense_enz of the circuit of FIG. 2b. Especially, FIG. 3 shows an operation of the control signal sense_enz, when the delay time of the delay unit 200 is controlled according to the test mode signals tm0, tm1, tm2 and tm3.

As shown in FIG. 3, while the control signal sest30 is enabled in a high level for a predetermined time, a timing of enabling the control signal sense_enz in a low level and a timing of disabling the control signal sense_enz in a high level can be controlled according to logical levels of the test mode signals tm0, tm1, tm2 and tm3.

That is, when the delay time of the delay unit 200 of FIG. 2b is the shortest (when tm1 has a high level), the timing of enabling the control signal sense_enz in a low level is the earliest.

Conversely, when the delay time of the delay unit 200 of FIG. 2b is the longest (when tm3 has a high level), the timing of enabling the control signal sense_enz in a low level is the latest.

Figure 4:
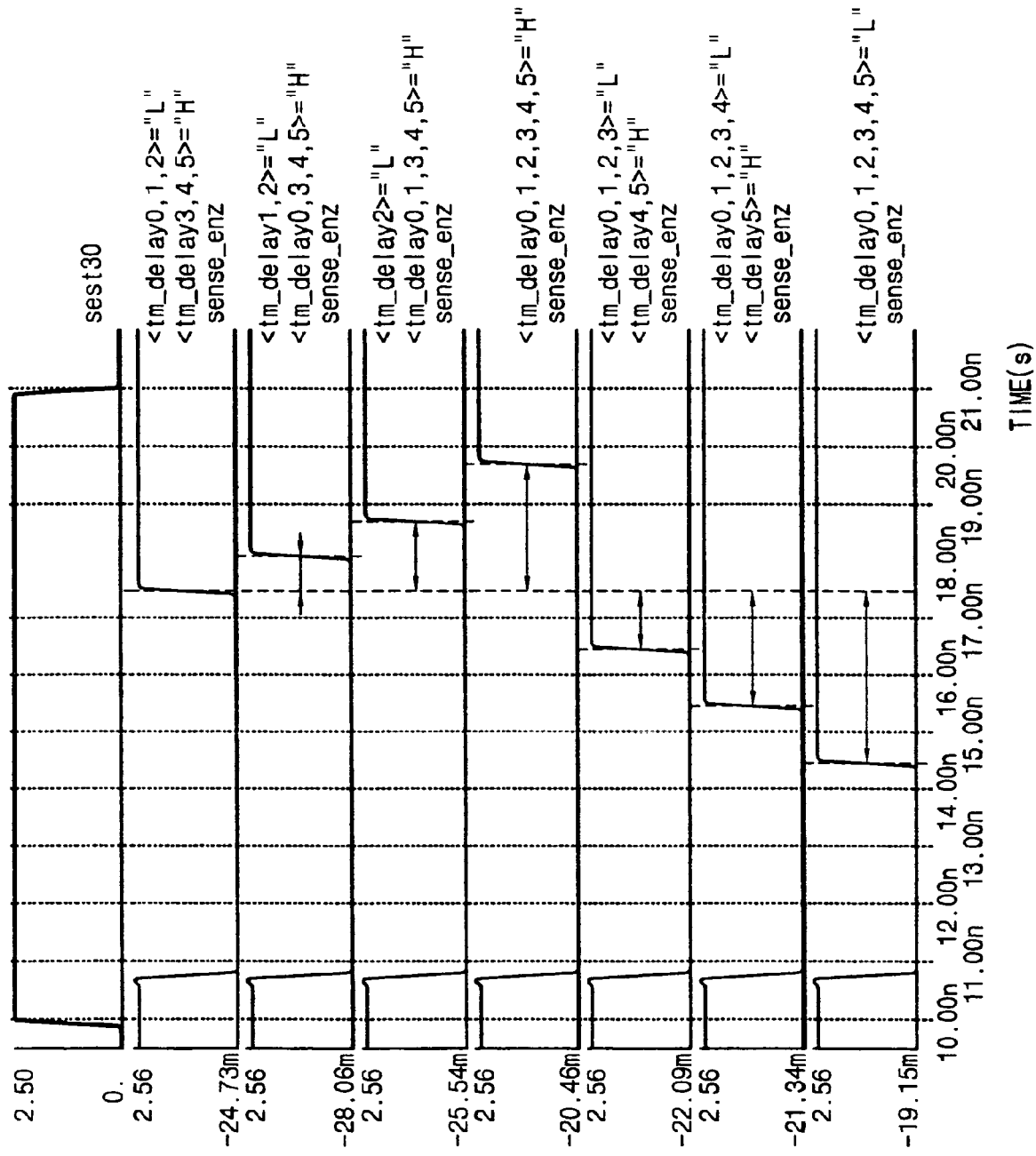
FIG. 4 is a waveform diagram illustrating another example of the signals of the circuit of FIG. 2b.

FIG. 4 is a waveform diagram illustrating another example of the signals sest30 and sense_enz of the circuit of FIG. 2b. Especially, FIG. 4 shows that the enable timing and period of the control signal sense_enz can be controlled according to variations of the delay time of the delay unit 200 and the delay time of the delay unit 210.

As depicted in FIG. 4, the timing of enabling the control signal sense_enz in a low level is identical. As explained in FIG. 3, it can be controlled by measuring the delay time of the delay unit 200.

The timing of disabling the control signal sense$_{13}$ enz in a high level can be adjusted by controlling the delay time of the delay unit 210. Accordingly, the period of enabling the control signal sense_enz in a low level can be controlled.

That is, when the delay time of the delay unit 210 is controlled by using the test mode signals tm_d0, tm_d1, tm_d2, tm_d3z, tm_d4z and tm_d5z, the disable timing of the control signal sense_enz can be controlled. On the other hand, as shown in FIG. 4, tm_delay0 is used instead of tm_d0, but denotes the same signal. It applies to the other test mode signals.

For example, still referring to FIG. 4, when the test mode signals tm_d0, tm_d1, tm$_{d2,}$ $_{tm}$_d3z, tm_d4z and tm_d5z have high levels to make the delay time of the delay unit 210 the longest, the disable timing of the control signal sense_enz becomes the latest. Therefore, when the delay time of the delay unit 200 is constant, the enable pulse period of the control signal sense_enz is the longest.

Conversely, when the test mode signals tm_d0, tm_d1, tm_d2, tm_d3z, tm_d4z and tm_d5z have low levels to make the delay time of the delay unit 210 the shortest, the disable timing of the control signal sense_enz becomes the earliest. Thus, when the delay time of the delay unit 200 is constant, the enable pulse period of the control signal sense_enz is the shortest.

Figure 5A:
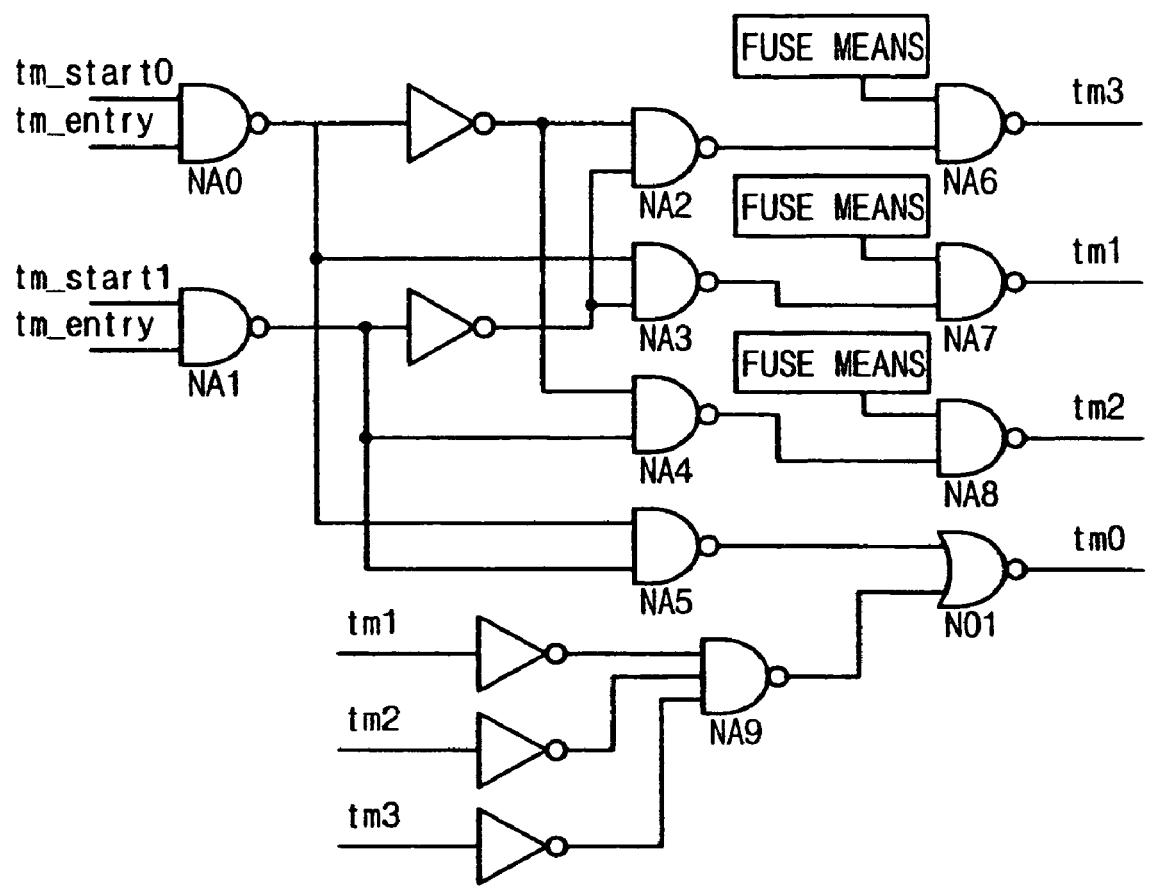
FIGS. 5a and 5b are, circuit diagrams illustrating a decoder circuit for generating test mode signals, respectively.
Figure 5B:
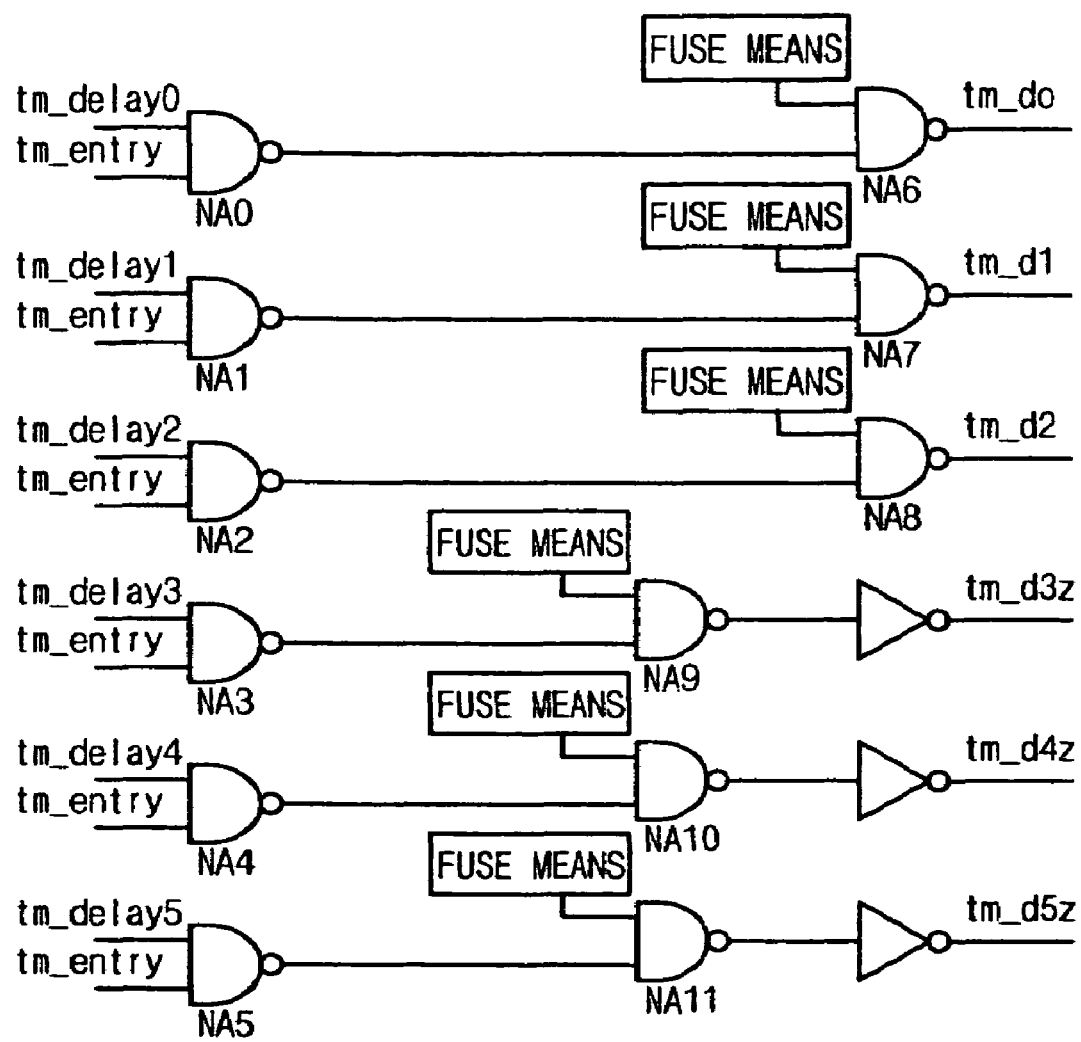

FIGS. 5a and 5b are circuit diagrams illustrating a decoder circuit for generating the test mode signals tm0, tm1, tm2 and tm3 for the delay unit 200 of the circuit of FIG. 2b and the test mode signals tm_d0, tm_d1, tm_d2, tm_d3z, tm_d4z and tm_d5z for the delay unit 210 thereof, respectively.

Figure 6:
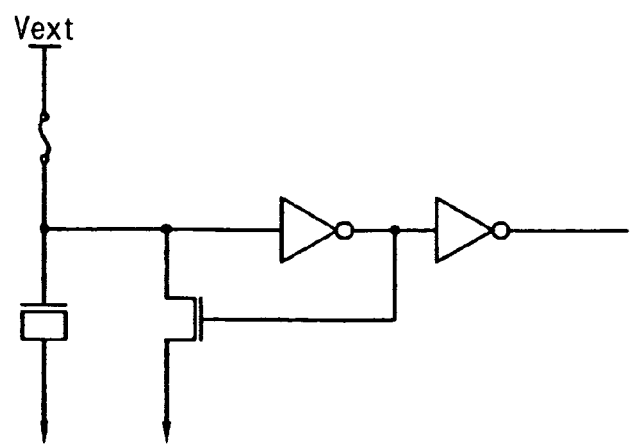
FIG. 6 is a circuit diagram illustrating a fuse means of FIGS. 5a and 5b.

As illustrated in FIG. 5a, the decoder circuit receives a test mode entry signal tm entry for notifying test mode entry and test mode address signals tm_start0 and tm_start1 for controlling the enable timing of the control signal sense_enz, and outputs the test mode signals tm0, tm1, tm2, and tm3. For information, one detailed example of a fuse means of FIG. 5a is shown in FIG. 6. In FIG. 5a, the decoder circuit includes a plurality of NAND gates NA0–NA9, a NOR gate NO1 and a plurality of inverters. An initial state of the fuse means maintains a high level, which will later be explained with reference to FIG. 6.

The operation of the decoder circuit of FIG. 5a will now be described.

When the test mode entry signal tm_entry has a low level, the output signals from the NAND gates NA0 and NA1 have high levels. Accordingly, the NAND gates NA2, NA3 and NA4 output high level signals, and the NAND gate NA5 outputs a low level signal. Logical levels of the test mode signals tm3, tm1 and tm2 which are the output signals from the NAND gates NA6, NA7 and NA8 are low. Therefore, a logical level of the test mode signal tm0 which is the output signal from the NOR gate NO1 is high. As mentioned above, when the test mode entry signal tm_entry has a low level (namely, not in the test mode), only the test mode signal tm0 has a high level.

When the test mode entry signal tm entry has a high level, logical levels of the test mode signals tm0, tm1, tm2 and tm3 are determined according to the test mode address signals tm_start0 and tm_start1. That is, when the test node address signals tm_start0 and tm_start1 have low levels (L and L), only the test mode signal tm0 has a high level. When the test mode address signals tm_start0 and tm_start1 have low and high levels (L and H), only the test mode signal tm1 has a high level. When the test mode address signals tm_start0 and tm_start1 have high and low levels (H and L), only the test mode signal tm2 has a high level. When the test mode address signals tm_start0 and tm_start1 have high levels (H and H), only the test mode signal tm3 has a high level.

As depicted in FIG. 5b, the decoder circuit outputs the test mode signals tm_d0~tm_d5z for controlling the disable timing of the control signal sense_enz. The decoder circuit receives test mode address signals tm_delay0~tm_delay5 for controlling the disable time of the control signal sense_enz.

The decoder circuit of FIG. 5b includes a plurality of NAND gates NA0~NA11 and a plurality of inverters. The circuit of FIG. 6 is used as a fuse means. Thus, the output signal outputted from the fuse means in an initial state has a high level.

When the test mode entry signal tm_entry has a low level (namely, not in the test mode), the test mode signals tm_d0~tm_d2 have low levels, and the test mode signals tm_d3z~tm_d5z have high levels.

When the test mode entry signal tm_entry has a high level, logical levels of the test mode signals tm_d0~tm_d2 and tm_d3z~tm_d5z can be controlled according to logical levels of the test mode address signals tm_delay0~tm_delay5.

FIG. 6 is a circuit diagram illustrating the fuse means of FIGS. 5a and 5b.

As shown in FIG. 6, the initial state of the fuse means has a high level in a fuse-coupled state and a low level in a fuse-cut state. In the case that the fuse is cut in FIGS. 5a and 5b so that the output from the fuse means can have a low level, logical levels of the test mode signals can be determined. It is thus possible to set the optimum enable period of the control signal sense_enz of the circuit of FIG. 2b.

Figure 7:
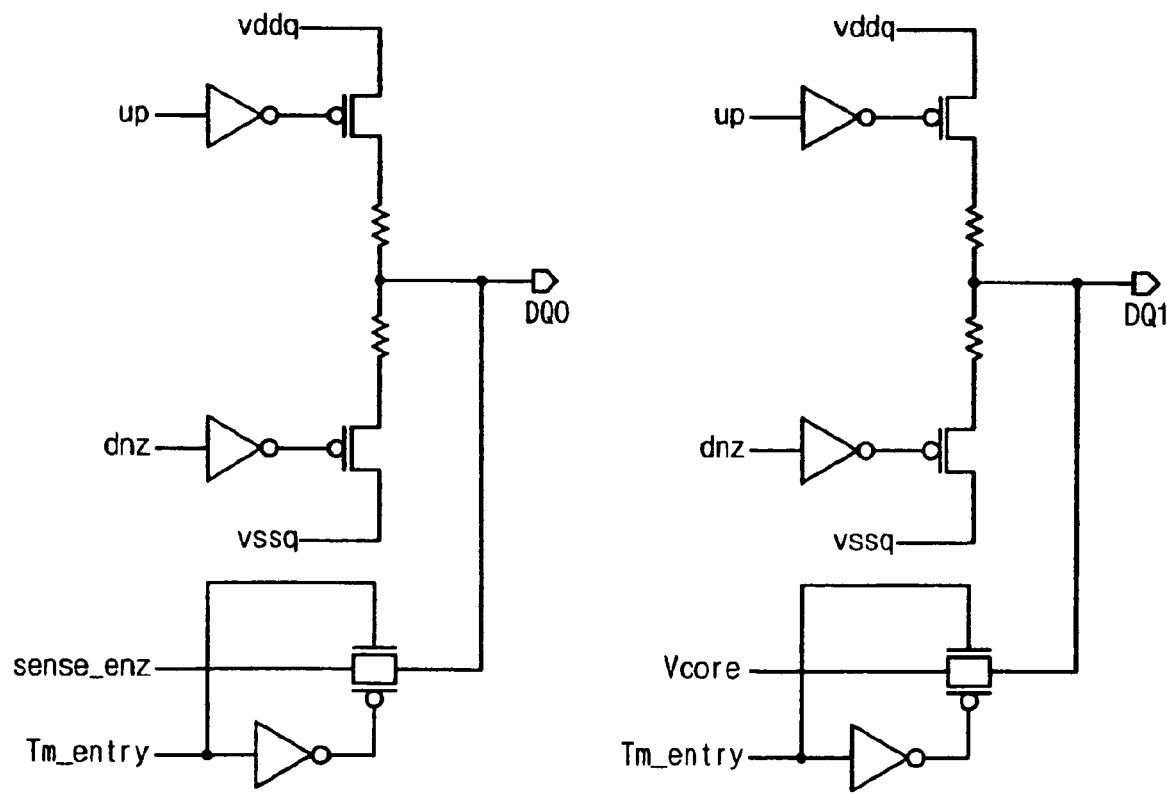
FIG. 7 is a circuit diagram illustrating a method for measuring a control signal and an internal voltage in a wafer or packaging state.

FIG. 7 is a circuit diagram illustrating a method for measuring the control signal sense_enz and the internal voltage Vcore in a wafer or packaging state. FIG. 7 also shows data drivers driven by a power voltage Vddq and a ground voltage Vssq. Here, up signal controls a pull-up driving transistor, and dnz signal controls a pull-down driving transistor.

Referring to FIG. 7, when the test mode entry signal tm_entry has a high level, the control signal sense_enz and the internal voltage Vcore are outputted through data pads DQ0 and DQ1.

Although not illustrated, operations of the data drivers coupled to the data pads DQ0 and DQ1 are intercepted in the test mode. Therefore, after the test mode is ended, the data pads DQ0 and DQ1 are used for the data drivers.

As described earlier, in accordance with the present invention, the operation of the internal voltage over-driver of FIG. 2a can be appropriately controlled by adjusting the enable period of the internal control signal. As a result, stabilized internal voltages can be provided to internal circuits.

As apparent from the above description, the enable period of the signal for controlling generation of the internal voltages of the memory device can be freely controlled.

In addition, the internal control signal can be measured even in the packaging state.

Furthermore, when the memory device has a defect, it can be directly corrected in the wafer level by using the fuse means.

As a result, the test price can be cut down and the yield can be improved without requiring additional expenses.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A device for controlling an operation of an internal voltage generator, comprising:

an internal voltage driver operatively connected to the internal voltage generator and to an output terminal of the device, the internal voltage driver configured to output an internal output voltage signal to the output terminal of the device;

an internal voltage over-driver operatively connected to the internal voltage driver and to an input terminal of the device, wherein the internal voltage over-driver configured to compensate for a potential level change at the output terminal of the device, the internal voltage over-driver comprising:

an enable delay circuit operatively connected to the input terminal of the device, the enable delay circuit having a transmission path operatively connected between the Input terminal of the device and the output node of the enable delay circuit in which the transmission path through the enable delay circuit comprises a plurality of switches interconnected operatively to a plurality of test mode enable signal lines, and a disable delay circuit operatively connected to the internal voltage driver wherein the disable delay circuit having a transmission line operatively connected between an input node of the disable delay circuit and the output node of the disable delay circuit in which the transmission line through the disable delay circuit comprising a plurality of RC time delay components interconnected operatively to a plurality of test mode disable signal lines; and a controller operatively connected to the internal voltage over-driver, to the internal voltage driver, and to the output terminal of the device, wherein the controller operatively connected to output nodes of the enable and disable delay circuits of internal voltage over-driver, the controller configured to control an enable timing and a disable timing of the internal voltage over-driver.

2. The device of claim 1, wherein the transmission path through the enable delay circuit is determined by the switches.

3. The device of claim 1, wherein the the transmission line through the disable delay circuit determined by the RC time delay components.

4. The device of claim 2 wherein the plurality of the test mode enable signal lines configured to selectively control the plurality of switches that determine the transmission path through internal voltage over-driver.

5. The device of claim 3 wherein the plurality of the test mode disable signal lines configured to contribute to determining the delay time of the transmission line through the disable delay circuit of the internal voltage over-driver.

6. The device of claim 1 wherein the internal voltage generator is an internal core voltage (Vcorr).

7. The device of claim 1, wherein the internal voltage driver comprising a PMOS transistor having a PMOS base, a PMOS gate, a PMOS source and a PMOS drain, wherein the PMOS base and the PMOS source operatively connected to the internal voltage generator and the PMOS gate operatively connected to the output terminal of the device, the PMOS drain operatively connected to an input node of the disable delay circuit; and a NMOS translator having a NMOS base, a NMOS gate, NMOS source, and a NMOS drain, wherein the NMOS base and the NMOS source are operatively connected to a common ground, the NMOS drain is operatively connected to the PMOS drain, and the NMOS gate is operatively connected to an output of an inverter.

8. The device of claim 1 wherein the plurality of RC delay time components comprise a plurality of NMOS transistors operatively interconnected to a plurality of PMOS capacitors.

9. The device of claim 1 further comprising a first probing circuit operatively connected to the device.

10. The device of claim 9 wherein the first probing circuit operatively connected to the output terminal of the deice and having a first data pad outlet.

11. The device of claim 9 further comprising a second probing circuit operatively connected to the device.

12. The device of claim 11, wherein the second probing circuit operatively connected to the internal voltage generator and having a second data pad outlet.

13. The device of claim 1 wherein the controller comprises a NAND gate having two inlets and one outlet, wherein one inlet of the NAND gate is operatively connected to the outlet node of the enable delay circuit and the other inlet of the NAND gate is operatively connected to the outlet node of the disable delay circuit; and two inverters in series operatively connected to the one outlet of the NAND gate.

14. The device of claim 1 further comprising an enable decoder circuit having a plurality of test mode entry signal inputs, a plurality of test mode delay signal inputs, a plurality of fuse means inlets, and a plurality of test mode enable signal outlets operatively interconnected together with each other, wherein the test mode enable signal outlets operatively connectable to the plurality of test mode enable signal lines of the enable delay circuit.

15. The device of claim 1 further comprising a disable decoder circuit having constituents of a plurality of test mode entry signal inputs, a plurality of test mode delay signal inputs, a plurality of fuse means inputs, and a plurality of test mode disable signal outlets, in which all of the constituents are operatively interconnected together, wherein the test mode disable signal outlets operatively connectable to the plurality of test mode disable signal lines of the disable delay circuit.

16. The device of claim 14 further comprising a plurality of fuse mean circuits operatively connected to the plurality of fuse means inlets of the enable decoder circuit.

17. The device of claim 15 further comprising a plurality of fuse mean circuits operatively connected to the plurality of fuse means inputs of the disable decoder circuit.

18. The device of claim 1 wherein the device is part of a finished semiconductor package.

19. A device for controlling an operation of an internal voltage generator, comprising:

an internal voltage driver operatively connected to the internal voltage generator and to an output terminal of the device, the internal voltage driver configured to output an internal output voltage signal to the output terminal of the device;

an internal voltage over-driver operatively connected to the internal voltage driver and to an input terminal of the device, wherein the internal voltage over-driver configured to compensate for a potential level change at the output terminal of the device, wherein the internal voltage over-driver comprising:

an enable delay circuit operatively connected to the input terminal of the device, the enable delay circuit having a transmission path operatively connected between the input terminal of the device and the output node of the enable delay circuit in which the transmission path through the enable delay circuit comprises a plurality of switches interconnected operatively to a plurality of test mode enable signal lines, wherein the plurality of the test mode enable signal lines configured to selectively control the plurality of switches that determine the transmission path through the internal voltage over-driver, and a disable delay circuit operatively connected to the internal voltage driver wherein the disable delay circuit having a transmission line operatively connected between an input node of the disable delay circuit and the output node of the disable delay circuit in which the transmission line through the disable delay circuit comprising a plurality of RC time delay components interconnected operatively to a plurality of test mode disable signal lines, wherein the plurality of the test mode disable signal lines configured to contribute to determining the delay time of the transmission line through the disable delay circuit of the internal voltage over-driver;

a controller operatively connected to the internal voltage over-driver, to the internal voltage driver, and to the output terminal of the device, wherein the controller operatively connected to output nodes of the enable and disable delay circuits of the internal voltage over-driver, the controller configured to control enable and disable timing of the internal voltage over-driver;

a first probing circuit operatively connected to the output terminal of the device and having a first data pad outlet;

a second probing circuit operatively connected to the internal voltage generator and having a second data pad outlet;

an enable decoder circuit having a plurality of test mode entry signal inputs, a plurality of test mode delay signal inputs, a plurality of fuse means inlets, and a plurality of test mode enable signal outlets operatively interconnected together with each other, wherein the test mode enable signal outlets operatively connected to the plurality of test mode enable signal lines of the enable delay circuit;

a disable decoder circuit having constituents of a plurality of test mode entry signal inputs, a plurality of test mode delay signal inputs, a plurality of fuse means inputs, and a plurality of test mode disable signal outlets, in which all of the constituents are operatively interconnected together, wherein the test mode disable signal outlets operatively connected to the plurality of test mode disable signal lines of the disable delay circuit;

a first plurality of fuse mean circuits operatively connected to the plurality of fuse means inlets of the enable decoder circuit; and a second plurality of fuse mean circuits operatively connected to the plurality of fuse means inputs of the disable decoder circuit.

20. A method of stabilizing an internal voltage in finished semiconductor package comprising the acts of:

obtaining a device for controlling an operation of an internal voltage generator, the device comprising:

an internal voltage driver operatively connected to the internal voltage generator and to an output terminal of the device, the internal voltage driver configured to output an internal output voltage signal to the output terminal of the device;

an internal voltage over-driver operatively connected to the internal voltage driver and to an input terminal of the device, wherein the internal voltage over-driver configured to compensate for a potential level change at the output terminal of the device, wherein the internal voltage over-driver comprising:

an enable delay circuit operatively connected to the input terminal of the device, the enable delay circuit having a transmission path operatively connected between the input terminal of the device and the output node of the enable delay circuit in which the transmission path through the enable delay circuit comprises a plurality of switches interconnected operatively to a plurality of test mode enable signal lines, wherein the plurality of the test mode enable signal lines configured to selectively control the plurality of switches that determine the transmission path through the internal voltage over-driver, and a disable delay circuit operatively connected to the internal voltage driver wherein the disable delay circuit having a transmission line operatively connected between an input node of the disable delay circuit and the output node of the disable delay circuit in which the transmission line through the disable delay circuit comprising a plurality of RC time delay components interconnected operatively to a plurality of test mode disable signal lines, wherein the plurality of the test mode disable signal lines configured to contribute to determining the delay time of the transmission line through the disable delay circuit of the internal voltage over-driver;

a controller operatively connected to the internal voltage over-driver, to the internal voltage driver, and to the output terminal of the device, wherein the controller operatively connected to output nodes of the enable and disable delay circuits of the internal voltage over-driver, the controller configured to control enable and disable timing of the internal voltage over-driver;

a first probing circuit operatively connected to the output terminal of the device and having a first data pad outlet;

a second probing circuit operatively connected to the internal voltage generator and having a second data pad outlet;

an enable decoder circuit having a plurality of test mode entry signal inputs, a plurality of test mode delay signal inputs, a plurality of fuse means inlets, and a plurality of test mode enable signal outlets operatively interconnected together with each other, wherein the test mode enable signal outlets operatively connected to the plurality of test mode enable signal lines of the enable delay circuit;

a disable decoder circuit having constituents of a plurality of test mode entry signal inputs, a plurality of test mode delay signal inputs, a plurality of fuse means inputs, and a plurality of test mode disable signal outlets, in which all of the constituents are operatively interconnected together, wherein the test mode disable signal outlets operatively connected to the plurality of test mode disable signal lines of the disable delay circuit;

a first plurality of fuse mean circuits operatively connected to the plurality of fuse means inlets of the enable decoder circuit; and a second plurality of fuse mean circuits operatively connected to the plurality of fuse means inputs of the disable decoder circuit;

controlling logic levels into the test mode enable signal lines of the enable delay circuit;

compensating logic levels into the test mode disable signal lines of the disable delay circuit; and measuring externally voltage changes as a function of time, wherein the measuring act performed at the first data pad outlet operatively connected to the output terminal of the device; and determining disable delay times of the disable delay circuit from the externally measured voltage and time changes.

* * * * *